(12) United States Patent
Chung et al.

(10) Patent No.: US 11,715,651 B2
(45) Date of Patent: Aug. 1, 2023

(54) APPARATUS FOR AND METHOD OF TREATING SUBSTRATE

(71) Applicant: SEMES CO., LTD., Cheonan-si (KR)

(72) Inventors: Young Dae Chung, Incheon (KR); Won Geun Kim, Goyang-si (KR); Jee Young Lee, Incheon (KR); Ji Hoon Jeong, Hwaseong-si (KR); Tae Shin Kim, Suwon-si (KR); Jung Suk Goh, Hwaseong-si (KR); Cheng Bin Cui, Hwaseong-si (KR); Ye Rim Yeon, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 203 days.

(21) Appl. No.: 17/079,445

(22) Filed: Oct. 24, 2020

(65) Prior Publication Data
US 2021/0134614 A1 May 6, 2021

(30) Foreign Application Priority Data
Oct. 30, 2019 (KR) .................. KR10-2019-0136863

(51) Int. Cl.
*H01L 21/67* (2006.01)

(52) U.S. Cl.
CPC .... *H01L 21/6708* (2013.01); *H01L 21/67115* (2013.01); *H01L 21/67248* (2013.01); *H01L 21/67253* (2013.01)

(58) Field of Classification Search
CPC ........... H01L 21/6708; H01L 21/67115; H01L 21/67248; H01L 21/67253; H01L 21/31111; H01L 21/0217; H01L 21/02307; H01L 21/2636; H01L 21/30604; H01L 21/67075; H01L 21/6715; H01L 21/68764; H01S 3/0007
See application file for complete search history.

(56) References Cited

U.S. PATENT DOCUMENTS

| | | | |
|---|---|---|---|
| 9,659,788 B2* | 5/2017 | Surla | H01L 21/0271 |
| 10,410,878 B2* | 9/2019 | Sun | H01L 21/0273 |
| 2001/0027748 A1* | 10/2001 | Ikegami | B05C 5/005 |
| | | | 118/305 |
| 2003/0206820 A1* | 11/2003 | Keicher | B29C 64/153 |
| | | | 419/9 |
| 2007/0004232 A1* | 1/2007 | Shareef | H01L 21/67109 |
| | | | 118/725 |
| 2011/0236675 A1* | 9/2011 | Oki | H01L 51/0003 |
| | | | 257/E21.09 |
| 2016/0221021 A1* | 8/2016 | Yang | B05B 17/0623 |
| 2019/0311923 A1* | 10/2019 | Kim | H01L 21/6708 |

(Continued)

FOREIGN PATENT DOCUMENTS

| | | |
|---|---|---|
| JP | 2009239098 | 10/2009 |
| JP | 2017103490 | 6/2017 |

(Continued)

*Primary Examiner* — Mohammed Shamsuzzaman

(57) ABSTRACT

A substrate treatment apparatus includes a substrate support unit, a chemical supply unit supplying a chemical solution onto an upper surface of a substrate supported on the substrate support unit, a laser irradiation unit applying a laser pulse to the substrate to heat the substrate, and a controller controlling the laser irradiation unit to emit the laser pulse such that the substrate is repeatedly heated and cooled to maintain a preset temperature.

7 Claims, 9 Drawing Sheets

(56) References Cited

U.S. PATENT DOCUMENTS

2021/0060625 A1\* 3/2021 Shin ................. H01L 21/67098
2021/0118701 A1\* 4/2021 Chung ............. H01L 21/30604
2021/0202280 A1\* 7/2021 Kim .................. B23K 26/0608

FOREIGN PATENT DOCUMENTS

| KR | 10-2017-0131779 A | 11/2017 | |
|---|---|---|---|
| KR | 10-2018-0048689 | 5/2018 | |
| KR | 10-2019-0117373 | 10/2019 | |
| WO | WO-2013113568 A2 \* | 8/2013 | ............... B05D 3/06 |
| WO | WO-2015133689 A1 \* | 9/2015 | ............. B08B 1/002 |

\* cited by examiner

APPARATUS FOR AND METHOD OF TREATING SUBSTRATE

The present application claims priority to Korean Patent Application No. 10-2019-0136863, filed on Oct. 30, 2019, the entire contents of which are herein incorporated by reference.

BACKGROUND OF THE INVENTION

1. Field of the Invention

The present invention relates to a substrate treatment apparatus and a substrate treatment method.

2. Description of the Related Art

An etching process for forming a pattern on a semiconductor substrate requires high etching selectivity and uniformity as well as high etching rate. As the integration of semiconductor devices advances, a higher etching selectivity and etching uniformity are required.

For example, in the case of a vertical NAND flash memory, hundreds of silicon oxide films and hundreds of silicon nitride films are alternately stacked on top of each other, and only the silicon nitride films are selectively etched to form a three-dimensional structure. To this end, it is important to etch the silicon nitride films as quickly as possible while suppressing the etching of the silicon oxide films. In addition, the uniformity in etching rate is required for a vertical direction in which the films are stacked as well as a radius direction of the substrate.

As an apparatus for selectively etching a silicon nitride film, a batch-type etching apparatus is known. The apparatus etches a silicon nitride films by dipping a semiconductor substrate with the silicon nitride film and a silicon oxide film in an etchant such as phosphoric acid that is maintained at a predetermined temperature. However, it is difficult to obtain good uniformity in etching rate and good etching selectivity with the batch-type etching apparatus. In order to solve this problem, an etching apparatus for etching substrates one by one has been proposed. However, it is still difficult to obtain the required etching characteristics even with such a non-batch apparatus in the case of a vertical NAND flash memory.

DOCUMENTS OF RELATED ART

Patent Document (Patent Document 1) Korean Patent Application Publication No. 10-2017-0131779 (Nov. 30, 2017)

SUMMARY OF THE INVENTION

The present invention has been made in view of the problems occurring in the related art and an objective of the present invention is to provide a substrate treatment apparatus and method capable of etching a silicon nitride film with a high selectivity.

Another objective of the present invention is to provide a substrate treatment apparatus and method capable of increasing an etching rate and improving etching uniformity in a vertical direction in which films are stacked by causing a vortex in an etching solution.

A further objective of the present invention is to provide a substrate treatment apparatus and method capable of minimizing fluctuations in temperature of an etching solution during an etching process.

The objectives and advantages of the present invention are not limited to those mentioned above, and other objectives and advantages of the present invention not mentioned above can be understood from a description given below.

According to an exemplary embodiment of the present invention, a substrate treatment apparatus includes a substrate support unit, a chemical supply unit configured to supply a chemical solution onto an upper surface of a substrate supported on the substrate support unit, a laser irradiation unit configured to apply a laser pulse to the substrate to heat the substrate, and a controller configured to control the laser irradiation unit to emit the laser pulse such that the substrate is repeatedly heated and cooled to maintain a preset temperature.

The apparatus further includes a temperature measurement member configured to measure a temperature of the substrate.

The controller is further configured to control the laser irradiation unit on the basis of the temperature of the substrate measured by the temperature measurement member.

The controller is further configured to control the laser irradiation unit such that a duty ratio of the laser pulse changes according to a difference between a reference temperature and the temperature measured by the temperature measurement member.

The controller is further configured to control the laser irradiation unit such that an intensity of the laser pulse is adjusted according to the temperature measured by the temperature measurement member.

The controller is further configured to control the laser irradiation unit such that the intensity of the laser pulse changes according to a difference between a reference temperature and the temperature measured by the temperature measurement member.

The laser irradiation unit is disposed below the substrate and configured to emit the laser pulse toward a rear surface of the substrate.

The laser pulse is a pulse in which a first time duration for which the pulse has a first laser intensity and a second time duration for which the pulse has a second laser intensity are alternately repeated. The second laser intensity is smaller than the first laser intensity, and equal to or greater than zero intensity.

The substrate has a stacked structure in which a silicon oxide film and a silicon nitride film are alternately and repeatedly stacked on each other. The chemical solution is an etching solution for selectively etching the silicon nitride film from the stacked structure.

The substrate support unit supports the substrate rotatably.

According to an exemplary embodiment of the present invention, a method of treating a substrate includes supplying a chemical solution to a substrate, heating the substrate to a predetermined temperature, and performing a substrate treatment process during a time when the substrate is irradiated with a laser pulse such that the substrate is repeatedly heated and cooled to maintain a preset temperature.

The method further includes measuring a temperature of the substrate, and controlling the laser pulse on the basis of the measured temperature of the substrate.

The controlling of the laser pulse includes adjusting a duty ratio of the laser pulse on the basis of the measured temperature.

The adjusting of the duty ratio of the laser pulse is performed according to a difference between a reference temperature and the measured temperature.

The controlling of the laser pulse includes adjusting an intensity of the laser pulse on the basis of the measured temperature.

The adjusting of the intensity of the laser pulse is performed according to a difference between a reference temperature and the measured temperature.

The method further includes monitoring a thickness of a chemical film on the substrate. In response to the monitored thickness of the chemical film being a predetermined thickness, the supplying of the chemical solution is stopped.

The substrate includes a stacked structure in which a silicon oxide film and a silicon nitride film are alternately and repeatedly stacked on each other. The chemical solution selectively etches the silicon nitride film from the stacked structure.

According to an exemplary embodiment of the present invention, a substrate treatment apparatus includes a substrate support unit made of a transparent material with respect to a laser pulse and configured to rotatably support a substrate, a chemical supply unit configured to eject a chemical solution onto an upper surface of a substrate supported on the substrate support unit, wherein a first portion of the chemical solution ejected forms a chemical film on the upper surface of the substrate and a second portion of the chemical solution ejected is scattered from the substrate, a chemical recovery unit configured to surround the substrate support unit to collect the second portion of the chemical solution scattered from the substrate to recycle the chemical solution scattered from the substrate, a laser irradiation unit positioned below the substrate support unit and configured to heat the substrate by applying a laser pulse to the substrate through the substrate support unit, a temperature measurement member configured to measure a temperature of the chemical film formed on the upper surface of the substrate, and a controller configured to control the laser irradiation unit to emit the laser pulse on the basis of the measured temperature of the chemical film such that the substrate is repeatedly heated and cooled to maintain a preset temperature.

The laser irradiation unit includes a laser generation member configured to receive a signal from a pulse generator and to generate the laser pulse, a lens member including a plurality of lenses and configured to refract the laser pulse generated by the laser generation member so that the laser pulse is applied to the substrate, a reflection unit configured to reflect a first portion of the laser pulse generated by the laser generation member toward the lens member and to pass a second portion of the laser pulse, an image pickup unit connected to the reflection unit and configured to form an image from the second portion of the laser pulse passing through the reflection unit and to convert the image into image data, and a sensing unit engaged with the reflection unit and configured to sense an intensity of the laser pulse incident on the reflection unit.

According to an exemplary embodiment of the present invention, it is possible to etch a silicon nitride film with a high etching selectivity by applying a laser pulse to a substrate such that the substrate to which an etching solution is supplied is repeatedly heated and cooled to maintain a preset temperature.

According to an exemplary embodiment of the present invention, heating and cooling are repeatedly performed to cause a temperature gradient which results in a vortex in an etching solution. The vortex increases the diffusion of the etching solution, thereby increasing an etching rate and improving uniformity in vertical etching.

According to an exemplary embodiment of the present invention, the temperature of the etching solution is measured in real time and the duty ratio and/or intensity of the laser pulses are adjusted on the basis of the measured temperature. Therefore, it is possible to minimize the temperature fluctuations of the etching solution during an etching process.

The effects and advantages that can be achieved by the present invention are not limited to the ones mentioned above, and other effects and advantages which are not mentioned above but can be achieved by the present invention can be clearly understood by those skilled in the art from the following description.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE EXEMPLARY EMBODIMENTS

Hereinbelow, exemplary embodiments of the present invention will be described in detail with reference to the accompanying drawings. Although the following description includes specific embodiments, the present invention is not limited thereto. In relation to describing the present disclosure, when the detailed description of the relevant known technology is determined to unnecessarily obscure the gist of the present disclosure, the detailed description may be omitted.

Figure 1:
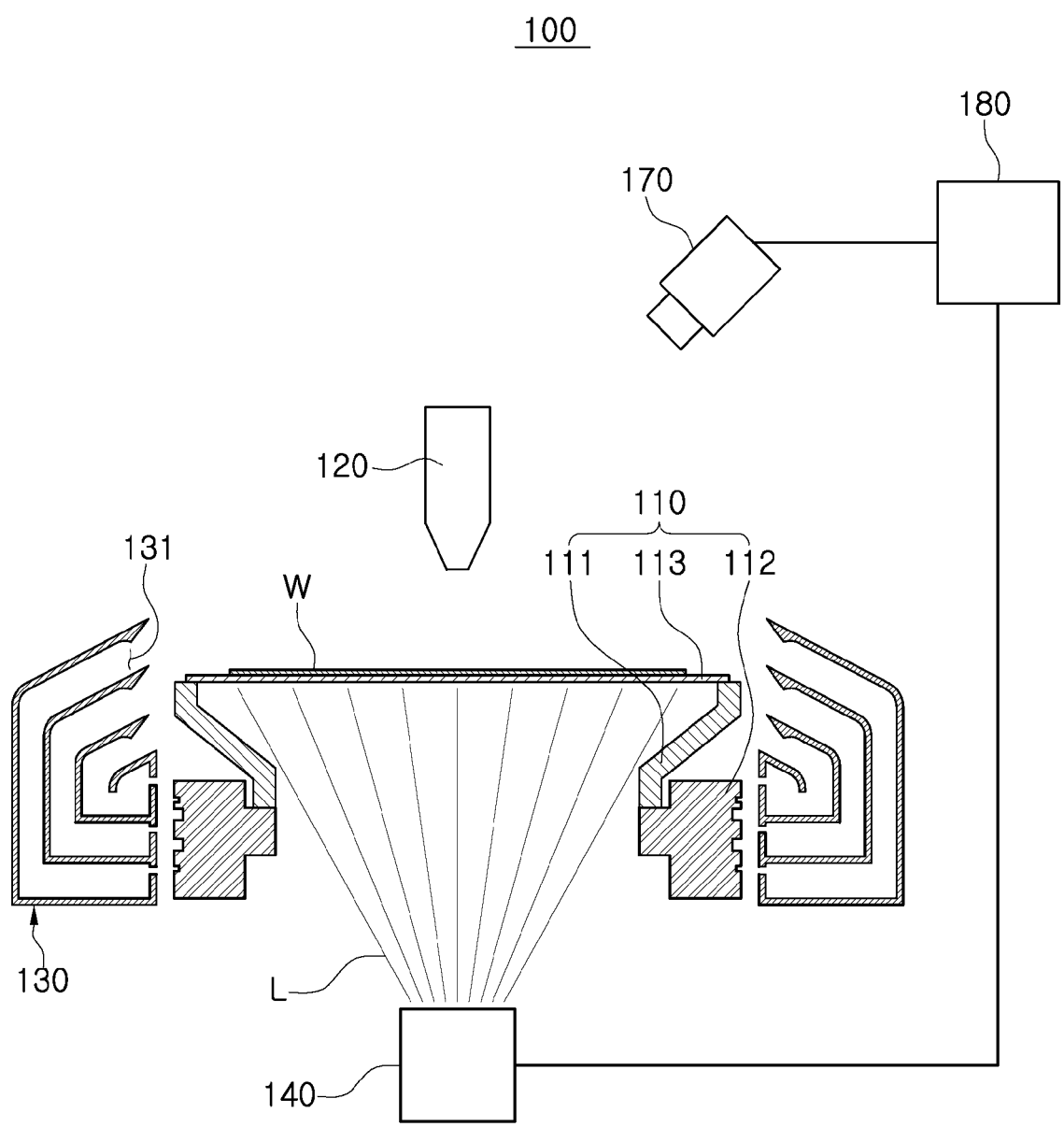
FIG. 1 is a view illustrating the construction of a substrate treatment apparatus according to one embodiment of the present invention.

FIG. 1 is a view illustrating the construction of a substrate treatment apparatus according to one embodiment of the present invention. Referring to FIG. 1, a substrate treatment apparatus 100 according to one embodiment of the present invention includes a substrate support unit 110, a chemical supply unit 120, a chemical recovery unit 130, a laser irradiation unit 140, a temperature measurement member 170, and a controller 180.

The substrate support unit 110 supports a substrate W during a substrate treatment process. The substrate W may be a semiconductor wafer. The substrate support unit 110 rotatably supports the substrate W. To this end, the substrate support unit 110 includes a rotation member 111, a drive member 112, and a support member 113.

The support member 113 supports the substrate W. The support member 113 is larger in size than the substrate W. When the substrate W is a circular wafer, the support member 113 has a larger diameter than the wafer.

Although not illustrated in FIG. 1, the support member 113 is provided with a plurality of supporting pins protruding from the surface thereof. The lower surface of the substrate W is supported by the supporting pins. The substrate W is spaced apart from the surface of the support member 113 due to the supporting pins, thereby providing an insertion space into which a robot hand can be inserted. The support member 113 is further provided with a retaining member that prevents the rotating substrate W from escaping from the support member 113. The retaining member is chuck pins installed around the periphery of the substrate W. When the substrate W is seated on the support member 113, the chuck pins are driven to approach the substrate W and positioned close to the periphery of the substrate W, thereby stably retaining the substrate W. The supporting pins and the chuck pins are existing components commonly included in conventional substrate treatment apparatuses.

When the laser irradiation unit 140 is disposed under the substrate W and is configured to apply a laser beam from the rear side of the substrate W, the support member 113 is made of a transparent material through which the laser beam can be transmitted. Accordingly, the laser beam emitted by the laser irradiation unit 140 can pass through the support member 113. The support member 113 is made of a corrosion-resistant material that does not react with a chemical solution supplied to the substrate W. The support member 113 is made of, for example, ceramic such as quartz or sapphire.

The rotation member 111 is connected to the support member 113 and rotated by the drive member 112. When the rotation member 111 is rotated, the support member 113 connected to the rotation member 111 is also rotated. Thus, the substrate W supported on the support member 113 is also rotated. The rotation member 111 has a vertical through hole at the center thereof. Therefore, a laser beam L emitted by the laser irradiation unit 140 can be applied to the lower surface of the substrate W without being interfered by the rotation member 111. As illustrated in FIG. 1, the rotation member 111 has a cylindrical shape in which the inner diameter increases from the bottom to the top. The connection portion between the rotation member 111 and the support member 113 is hermetically sealed so that the chemical solution supplied to the substrate W cannot enter the laser irradiation unit 140.

The drive member 112 is engaged with the rotation member 111 to rotate the rotation member 111. Any driving device can be used as the drive member 112 if it can rotate the rotation member 111.

The chemical supply unit 120 includes one or more chemical ejection nozzles configured to eject a chemical solution to the substrate W from above the substrate W. The chemical supply unit 120 pumps a chemical solution stored in a storage tank (not illustrated) and ejects the chemical solution to the substrate W. The chemical supply unit 120 includes a drive unit and is configured to reciprocate between a chemical ejection position which is directly above the substrate W is and a standby position which is deviated from the substrate W.

The chemical solution supplied to the substrate W by the chemical supply unit 120 varies according to the substrate treatment process. When the substrate treatment process is a silicon nitride film etching process, the chemical solution may be an aqueous solution of phosphoric acid ($H_3PO_4$). The chemical supply unit 120 is equipped with a deionized water supply nozzle (DIW) for rinsing the surface of the substrate after the etching process is performed, an isopropyl alcohol (IPA) ejection nozzle (IPA) for drying the substrate after the rinsing is performed, and a nitrogen ($N_2$) ejection nozzle fore ejecting nitrogen gas.

The chemical recovery unit 130 recovers (i.e., collects) a chemical solution scattered from the substrate to recycle the collected chemical solution. The chemical recovery unit 130 surrounds the substrate support unit 110. The chemical recovery unit 130 includes a plurality of cups arranged in a vertical direction in an overlapped manner. The chemical recovery unit 130 has multiple inlets 131 for recovering various chemicals, respectively. The multiple inlets 131 are arranged side by side in the vertical direction. Different chemical solutions are introduced into the respective inlets 131. To this end, a difference in height between the substrate support unit 110 and the chemical recovery unit 130 is adjustable.

The laser irradiation unit 140 is configured to apply a laser beam to the substrate W. The laser irradiation unit 140 is disposed below the substrate support unit 110. The laser irradiation unit 140 applies a laser beam to the substrate S placed on the substrate support unit 110. The laser beam emitted by the laser irradiation unit 140 passes through the support member 113 of the substrate support unit 110 and reaches the substrate W. Therefore, the substrate W can be heated to a specific temperature.

Figure 2:
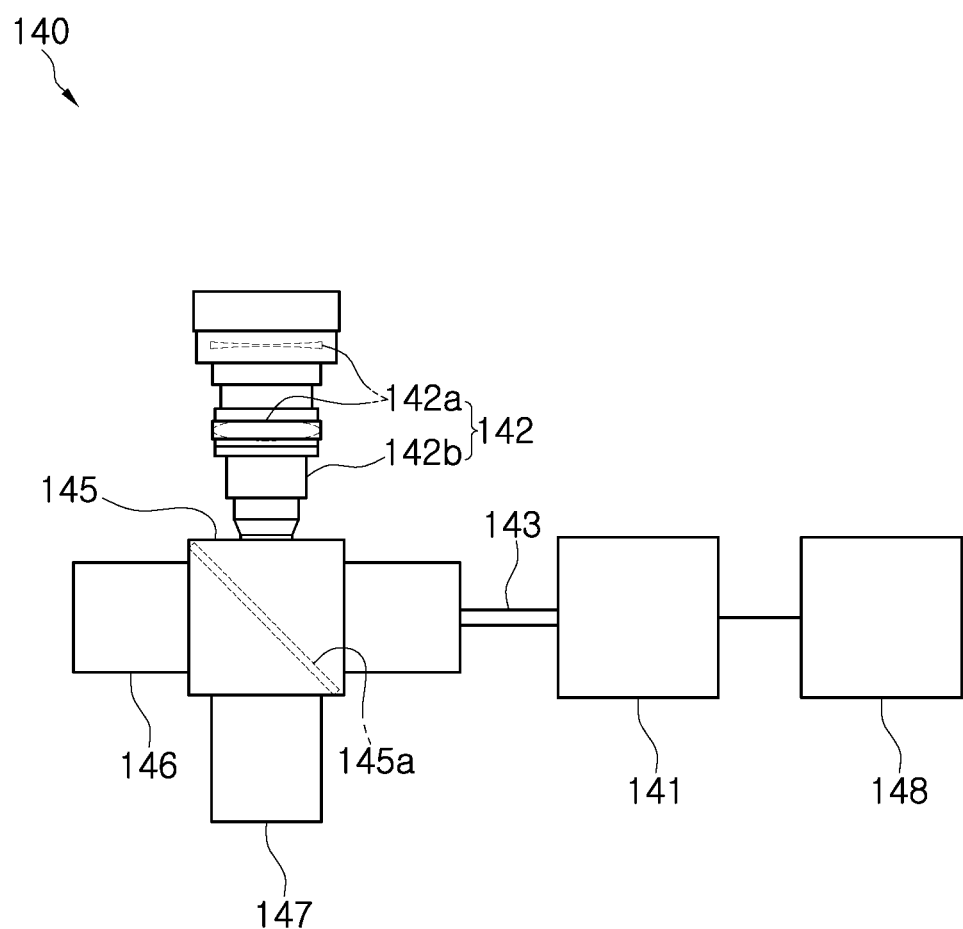
FIG. 2 is a view illustrating the construction of a laser irradiation unit according to one embodiment of the present invention.

The laser irradiation unit 140 is configured to apply a laser beam uniformly to the front surface of the substrate W. An exemplary detailed configuration for this will be described with reference to FIG. 2. Referring to FIG. 2, the laser irradiation unit 140 includes a laser generation member 141, a lens member 142, and a laser transfer member 143. The laser generation member 141 generates a laser beam. The laser generation member 141 generates a laser beam having a wavelength that can be easily absorbed by the substrate W. The laser generation member 141 receives a signal from a pulse generator 148 and generates a pulsed laser beam. The laser pulse is formed such that a laser emission period (ON) and a laser non-emission period (OFF) alternately occur or such that a first laser intensity and a second laser intensity alternately occur.

The lens member 142 deflects the laser beam generated by the laser generation member 141 so that the laser beam can be directed toward the substrate. The lens member 142 includes multiple lenses 142a and a lens barrel 142b. The lenses 142a include concave lenses or convex lenses. The lens barrel 142b accommodates the lenses 142a and is configured to allow a relative distance between each of the lenses 142a to be varied. Therefore, the laser beam generated by the laser generation member 141 is refracted while passing through the lens member 142 and is uniformly incident on the entire area of the substrate W. In the drawings, two lenses 142a are illustrated. However, the two lenses are only illustrative. Depending on the design of the substrate treatment apparatus 100, the number and type (convex lens and concave lens) of the lenses 142a are appropriately selected.

The laser transfer member 143 connects the laser generation member 141 and the lens member 142 and transfers the laser beam generated by the laser generation member 141 to the lens member 142. An example of the laser generation member 141 is an optical fiber.

The laser irradiation unit 140 includes a reflection unit 145, an image pickup unit 146, and a sensing unit 147. The reflection unit 145 reflects a portion of the laser beam generated by the laser generation member 141 and passes the remaining portion of the laser beam therethrough. To this end, the reflection unit 145 includes a reflection mirror 145a installed at an angle of 45°.

The image pickup unit 146 is connected to the reflection unit 145. The image pickup unit 146 forms an image from the laser beam passing through the reflection unit 145 and converts the image into image data. The image pickup unit 146 checks whether the laser beam is output by the laser generation member 141 in the form as designed by analyzing the image data. In an example embodiment, the image pickup unit 146 may include a CMOS (complementary metal oxide semiconductor) image sensor or CCD (charge coupled device) image sensor.

The sensing unit 147 is connected to the reflection unit 145 and senses the intensity of the laser beam incident on the reflection unit 145. The sensing unit 147 is implemented, for example, with a photo detector. When the intensity of the laser beam is excessively strong, the substrate is rapidly heated. When the intensity of the laser beam is too weak, it takes a long time for the substrate to be heated. The sensing unit 147 determines whether the intensity of the laser beam is appropriate.

In the embodiment described above, the laser irradiation unit 140 is disposed under the substrate W and applies a laser beam to the rear surface of the substrate W. However, the present invention is not limited to the configuration. For example, the laser irradiation unit may be disposed above the substrate W to apply a laser beam to the front surface of the substrate W.

Referring to FIG. 1, the temperature measurement member 170 measures the temperature of the substrate W. Alternatively, the temperature measurement member 170 measures the temperature of a chemical film that is formed on the upper surface of the substrate W through a process of applying a chemical solution to the surface of the substrate W. The chemical film may be a liquid film which is a portion of the chemical solution applied to the surface that remains on the surface of the substrate W. The chemical film may also be referred to as a liquid film. To this end, the temperature measurement member 170 includes a thermal imaging camera installed above the substrate W.

The controller 180 controls the laser irradiation unit 140 to irradiate the substrate W with a laser beam. Specifically, the controller 180 controls the pulse generator 148 to generate a pulse signal having a predetermined intensity and/or duty ratio and transmits the pulse signal to the laser generation member 141 so that a laser pulse can be formed by the laser generation member 141. The controller 180 controls the laser irradiation unit 140 on the basis of the measurement results of the temperature measurement member 170.

Figure 3:
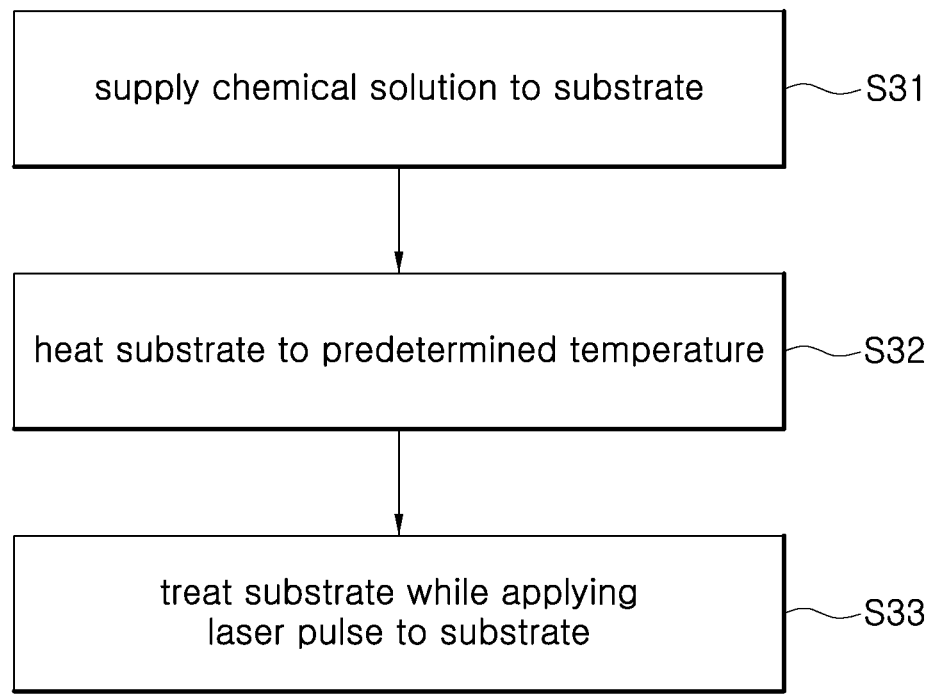
FIG. 3 is a flowchart illustrating a substrate treatment method according to one embodiment of the present invention.

FIG. 3 is a flowchart illustrating a substrate treatment method according to one embodiment of the present invention. Referring to FIG. 3, a substrate treatment method according to one embodiment of the present invention includes: supplying a chemical solution to a substrate at step S31; heating the substrate to a predetermined temperature at step S32; and performing a process while irradiating the substrate with a laser pulse at step S33.

Referring to FIGS. 1 to 3, in step S31, the chemical supply unit 120 applies a chemical solution to the upper surface of a substrate supported on the substrate support unit 110. The chemical solution supplied to the substrate varies according to the substrate treatment process. When the substrate treatment process is an etching process, the chemical solution may be an etching solution. For example, in the case of a silicon nitride film etching process, the chemical solution may be an aqueous solution of phosphoric acid. The substrate W may be rotated while the chemical solution is supplied to the substrate W. Specifically, the rotation member 111 and the support member 113 are rotated by the drive member 112, and thus the substrate W is also rotated. Since the substrate W is rotated, the chemical solution supplied to the upper surface of the substrate W is spread evenly across the entire area of the front surface of the substrate W.

The supply of the chemical solution and the rotation of the substrate may continue all the way through the substrate treatment process. That is, the substrate treatment process is performed while a new medicinal solution is continuously supplied to the upper surface of the substrate W. When the substrate W is rotated, a chemical solution scattered from the substrate W enters the chemical recovery unit 130 through the inlet 131.

Alternatively, the supply of the chemical solution only lasts until a liquid film is formed on the upper surface of the substrate W to a predetermined thickness. Thereafter, no new chemical solution is supplied to the substrate W during the subsequent substrate treatment process. That is, the substrate is treated with only the liquid film on the upper surface of the substrate W without a new chemical solution being continuously supplied to the upper surface of the substrate W. In this case, in a state in which the supply of a chemical solution to the substrate W is stopped, the substrate W is not rotated or is rotated at a speed at which the chemical solution on the substrate W does not scatter.

Alternatively, in the state in which the supply of a chemical solution is interrupted after a film of a predetermined thickness is formed on the upper surface of the substrate W, the supply of a chemical solution may be resumed when a replenishment of the chemical solution is required during the substrate treatment process. That is, when the concentration of a chemical solution changes during the progress of the substrate treatment process, or a chemical loss occurs due to the substrate rotation, the chemical supply unit 120 ejects the chemical solution to compensate for the loss of the chemical solution supplied to the substrate W.

When a chemical solution is supplied to the upper surface of the substrate W and thus a liquid film is formed, the substrate W is heated to a predetermined temperature (Step S32). Alternatively, the substrate W is heated during the formation of the liquid film on the upper surface of the substrate W. The predetermined temperature is a process temperature at which the substrate treatment process is performed. The laser beam is applied to the substrate W from the laser irradiation unit 140 to heat the substrate W. The laser beam emitted by the laser irradiation unit 140 passes through the support member 113 and is incident on the substrate W. The laser beam is refracted while passing through the lens member 142 and is uniformly incident on the entire area of the substrate W. The laser beam is emitted in the foim of a continuous wave until the temperature of the substrate temperature reaches the predetermined temperature.

Step S32 of heating the substrate W to the predetermined temperature is not limited to a method of applying a laser beam to the substrate W. For example, a lamp such as a UV lamp can be used as a heating unit to heat the substrate W. Alternatively, both of the lamp and the laser irradiation unit 140 can be used to heat the substrate W.

When the temperature of the substrate W reaches the predetermined temperature, the substrate W is processed while applying a laser beam to the substrate W at step S33. In more detail, the controller 180 receives the temperature measurement results from the temperature measurement member 170 and controls the laser irradiation unit 140 to output a laser pulse when it is determined that the predetermined temperature is reached. The controller 180 controls the pulse generator 148 to generate a pulse signal, and the laser generation member 141 generates a laser beam according to the generated pulse signal. The generated laser beam is applied to the substrate W so that the temperature of the substrate W can be maintained.

In step S33, the substrate treatment process is a process of etching a silicon nitride film using an aqueous solution of phosphoric acid.

Figure 4:
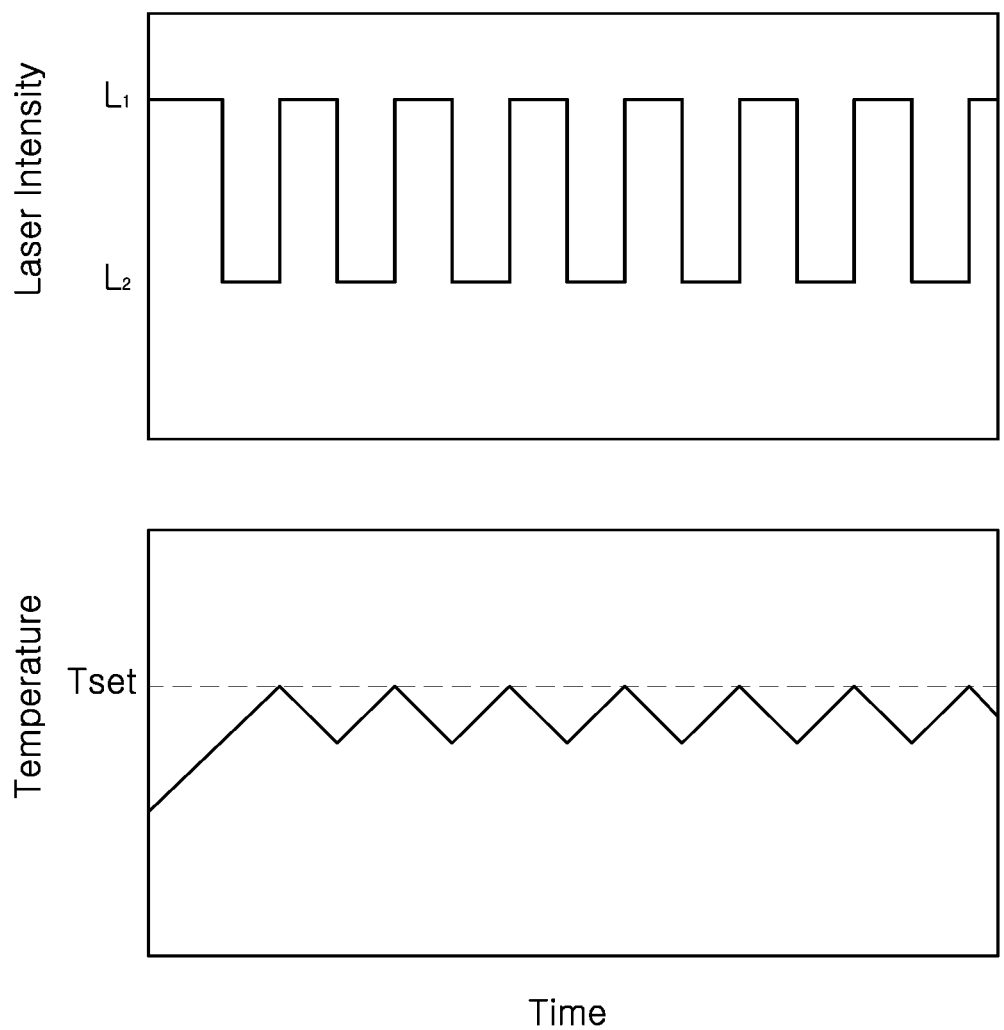
FIG. 4 is a view illustrating changes in laser pulse and substrate temperature in one embodiment of the present invention.

Referring to FIG. 4, changes in laser pulse and substrate temperature will be described. As illustrated in FIG. 4, the laser pulse is formed such that a first intensity L1 and a second intensity L2 alternately repeat in a laser beam. In this case, the value of the second laser intensity L2 is zero. That is, the laser pulse is formed in a manner that emission (ON) and non-emission (OFF) of a laser beam alternately repeat with a predetermined duty ratio. In some cases, the value of the second intensity L2 is greater than zero and is smaller than the value of the first intensity L1. In this case, instead of an operation in which the emission (ON) and the non-emission (OFF) of a laser beam alternately repeat, laser beams with different intensities are alternately emitted. In an example embodiment, the laser pulse is a pulse in which a first time duration for which the pulse has the first laser intensity L1 and a second time duration for which the pulse has the second intensity L2 are alternately repeated. The second laser intensity L2 is smaller than the first laser intensity L1, and equal to or greater than zero intensity. In an example embodiment, the first time duration and the second time duration may be set to the same as each other or may be set to be different from each other. In an example embodiment, each of the first time duration and the second time duration may vary as time of laser application passes.

With such a laser pulse, the substrate temperature is periodically raised and lowered. That is, when the laser beam with the second intensity L2 is emitted (i.e., the laser beam is in the OFF state), the substrate temperature decreases. On the other hand, when the laser beam with the first intensity L1 is emitted (i.e., the laser beam is in the ON state), the substrate temperature increases. By applying the laser pulse to the substrate, the substrate temperature is rapidly raised and lowered in the vicinity of a predetermined temperature TSET. Although the substrate temperature is repeatedly raised and lowered, the average temperature of the substrate can be maintained constant. That is, each of the intensity and the duty ratio of the laser pulse is set such that the temperature of the substrate does not gradually increase or decrease over time.

Figure 5:
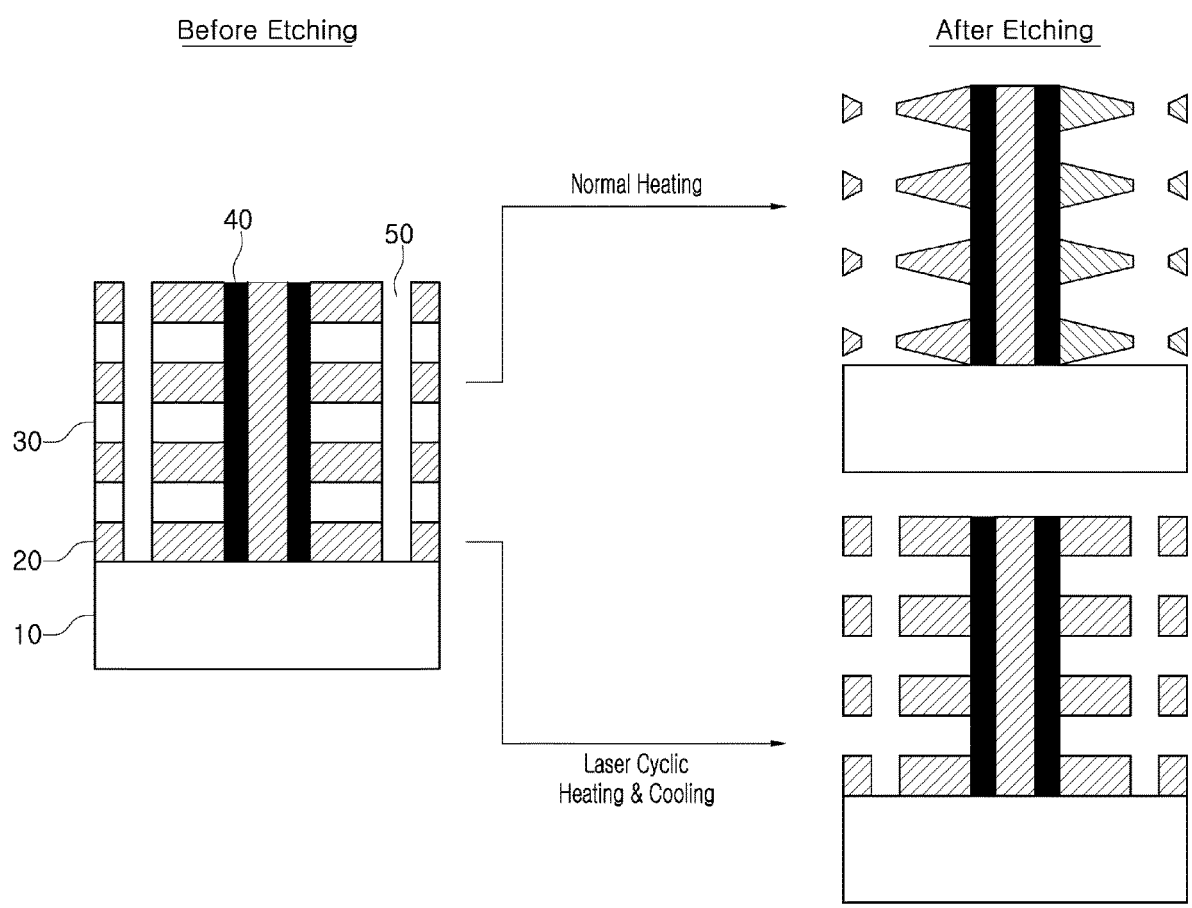
FIG. 5 is a view illustrating improvement in etching selectivity in one embodiment of the present invention.

FIG. 5 is a view illustrating an effect of the present invention in the case where the present invention is applies to a process of etching a silicon nitride film in a multilayer structure in which multiple silicon nitride films and silicon oxide films are alternately stacked. Referring to FIG. 5, an exemplary multilayer structure to be subjected to the etching process is a structure in which silicon oxide films 20 and silicon nitride films 30 are alternately stacked on a base layer 10 and a slit 50 extending through the silicon oxide films 20 and the silicon nitride films 30 is formed. The slit 50 serves as a passage through which an etching solution is supplied in the subsequent etching process or a passage through which the by-products of an etching process are discharged to the outside.

When an etching solution such as phosphoric acid is supplied to the multilayer structure described above and a conventional heating method is used to maintain the substrate temperature, there is a possibility that not only the silicon nitride films 30 are etched but also the silicon oxide films 20 are partially etched. As a result, the silicon oxide films 20 have a trapezoidal shape as illustrated in FIG. 5 after the etching process is completed.

On the other hand, when the substrate is repeatedly rapidly heated and cooled by applying a laser pulse to the substrate, the etching of the silicon oxide films 20 is suppressed and the silicon nitride films 30 can be etched away. Therefore, the cross-sectional shape of the silicon oxide films 20 hardly changes during the etching of the silicon nitride films.

According to an embodiment of the present invention, it is possible to improve the etching selectivity. The principle of causing this effect is not clear, but it is assumed that it is because sufficient energy to overcome the activation energy barrier to cause etching reactions of silicon oxide films cannot be accumulated on the substrate due to the rapid heating and cooling of the substrate. That is, when the heating and cooling are repeatedly, rapidly performed, the silicon nitride films can be well etched because the silicon nitride films have a relatively low activation energy barrier compared to the silicon oxide films, but the etching of the silicon oxide films is suppressed because the silicon oxide films have a relatively high activation energy barrier.

Particularly, according to the present invention, since the substrate is heated by a laser pulse, the substrate can be rapidly heated and cooled. When the substrate is repeatedly heated and cooled using a heating method other than a laser pulse, the thermal energy supplied to the substrate cannot be removed as quickly as the case of using a laser pulse. For example, when a substrate is repeatedly heated and cooled by turning on and off a lamp heater, heat can still be transferred from the lamp heater to the substrate even during a period in which the lamp heater is turned off. This provides an opportunity for energy to accumulate on the substrate to the extent that the accumulated energy exceeds the activation energy barrier to etch the silicon oxide films.

In addition, according to the embodiments of the present invention, since the substrate is repeatedly heated and cooled, a temperature gradient occurs in a liquid film formed of a chemical solution that is supplied to the surface of the substrate. Therefore, it is possible to uniformly treat the substrate in a vertical direction in which the films to be etched are stacked. For example, in the case where the silicon nitride films in the structure illustrated in FIG. 5 are etched with an etching solution, the by-products of the etching process are gradually accumulated on the substrate while the etching progresses to reach the base layer 10. Therefore, the etching solution becomes difficult to reach deeper silicon nitride films when the etching solution is supplied through the slit 50. This may result in a difference in etching rate between an upper portion and a lower portion of the multilayer structure subjected to the etching. However, according to the embodiments of the present invention, while the substrate is repeatedly heated and cooled, a vertical temperature gradient occurs within the etching solution, resulting in vertex generation in the etching solution. This facilitates the diffusion of the etching solution in the slit. Therefore, the uniformity of etching in the vertical direction in which films are stacked can be improved.

Figure 6:
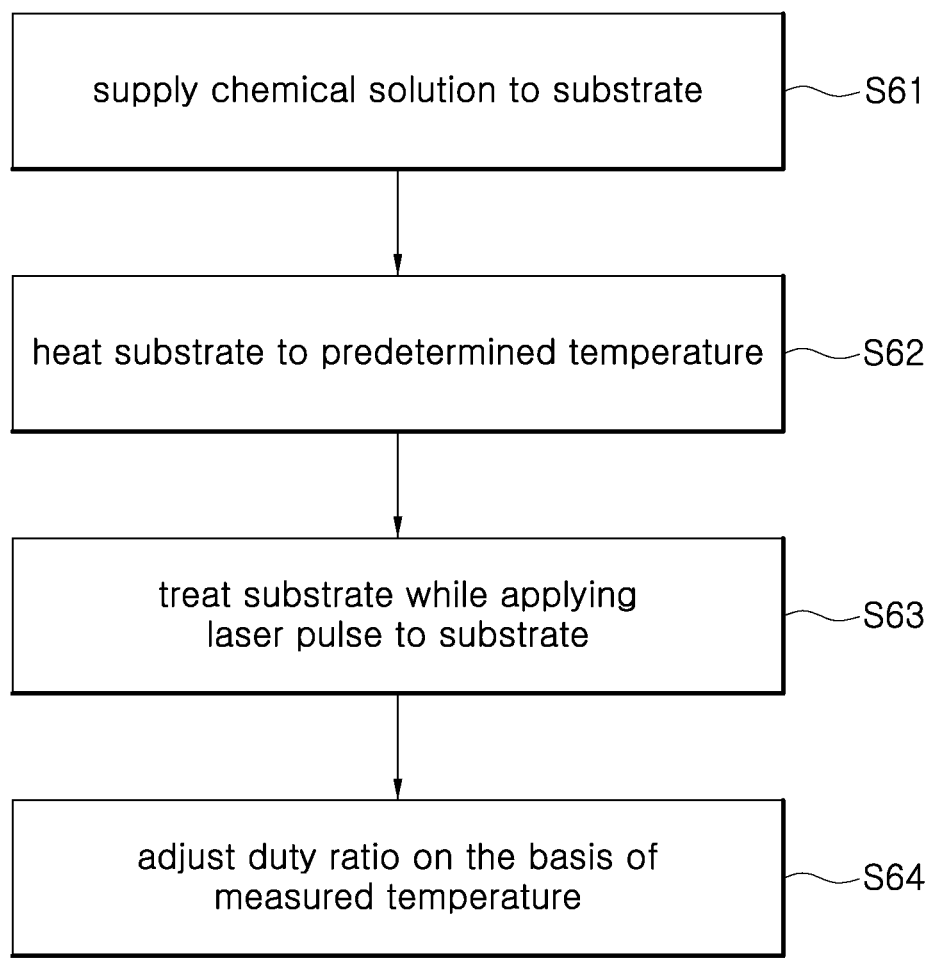
FIG. 6 is a flowchart illustrating a substrate treatment method according to another embodiment of the present invention.

FIG. 6 is a flowchart illustrating a substrate treatment method according to another embodiment of the present invention. Referring to FIG. 6, the substrate treatment method includes: supplying a chemical solution to a substrate (S61), heating the substrate to a predetermined temperature (S62), performing a surface treatment while applying a laser pulse to the substrate (S63), and adjusting a duty ratio of the laser pulse on the basis of a temperature measured. Since steps S61 through S63 are the same as steps S31 through S33 of FIG. 3, a detailed description thereof will be omitted.

As described above, the duty ratio of the laser pulse emitted in step S63 is set such that the average temperature of the substrate remains constant even though the laser pulse is repeatedly applied to the substrate. However, even in this case, temperature variations may occur during the actual process. For example, when an aqueous solution of phosphoric acid is supplied to the upper surface of the substrate to form a liquid film and an etching process is then performed, the concentration and/or volume of the aqueous solution of phosphoric acid changes as the etching process progresses, which may lead to a change in the temperature of the liquid film. In addition, when the chemical solution is additionally supplied to the substrate during the etching process, a change in temperature of the liquid film may occur.

Figure 7:
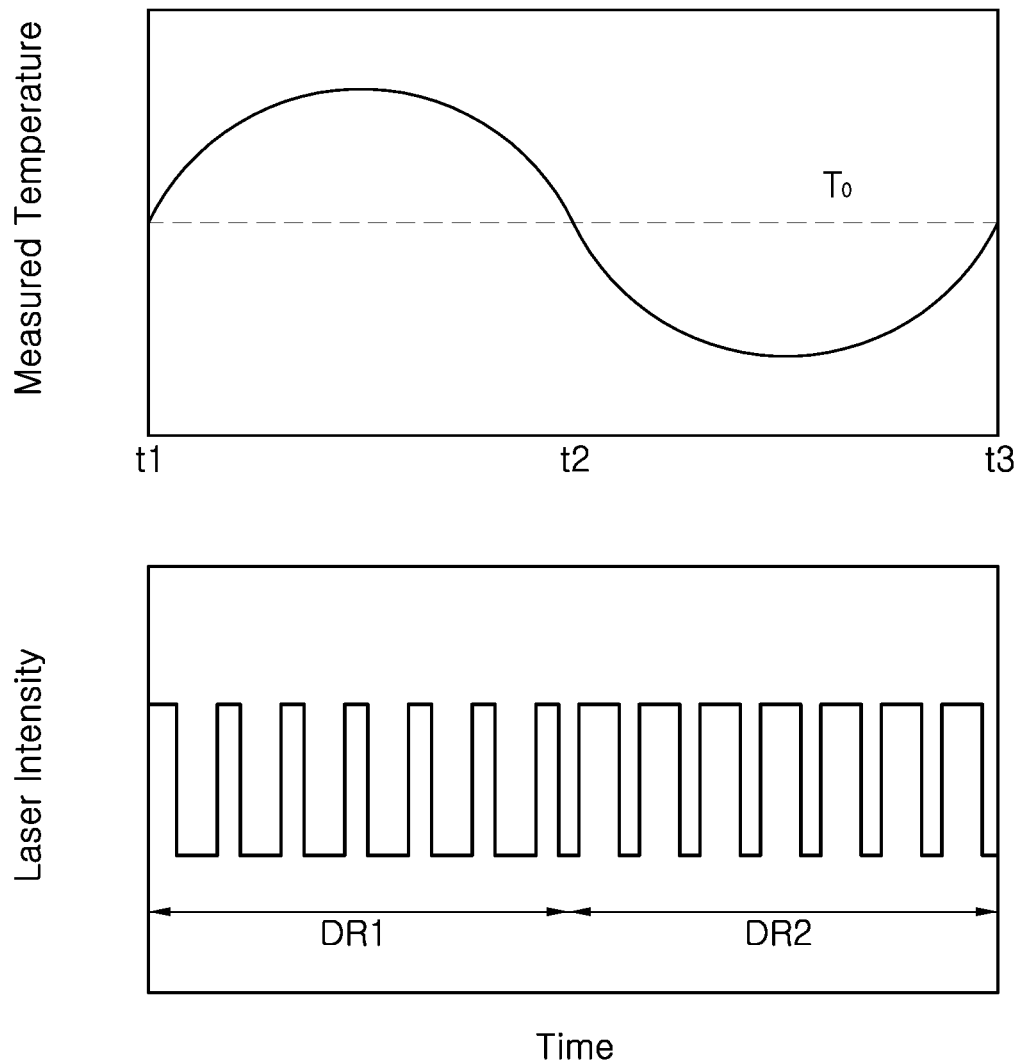
FIG. 7 is a view illustrating changes in laser pulse and substrate temperature in the embodiment of the present invention shown in FIG. 6.

To compensate for this temperature change, in step S64, the duty ratio of the laser pulse is adjusted on the basis of the temperature measured by the temperature measurement member 170. That is, as illustrated in FIG. 7, when the temperature exceeds a reference temperature To, the duty ratio is reduced to DR1. On the other hand, when the temperature falls below the reference temperature To, the duty ratio is increased to DR2. FIG. 7 illustrates a case in which the duty ratio is switched between DR1 and DR2 according to the measured temperature. However, the duty ratio may be adjusted to continuously change on the basis of the difference between the measured temperature and the reference temperature To.

Figure 8:
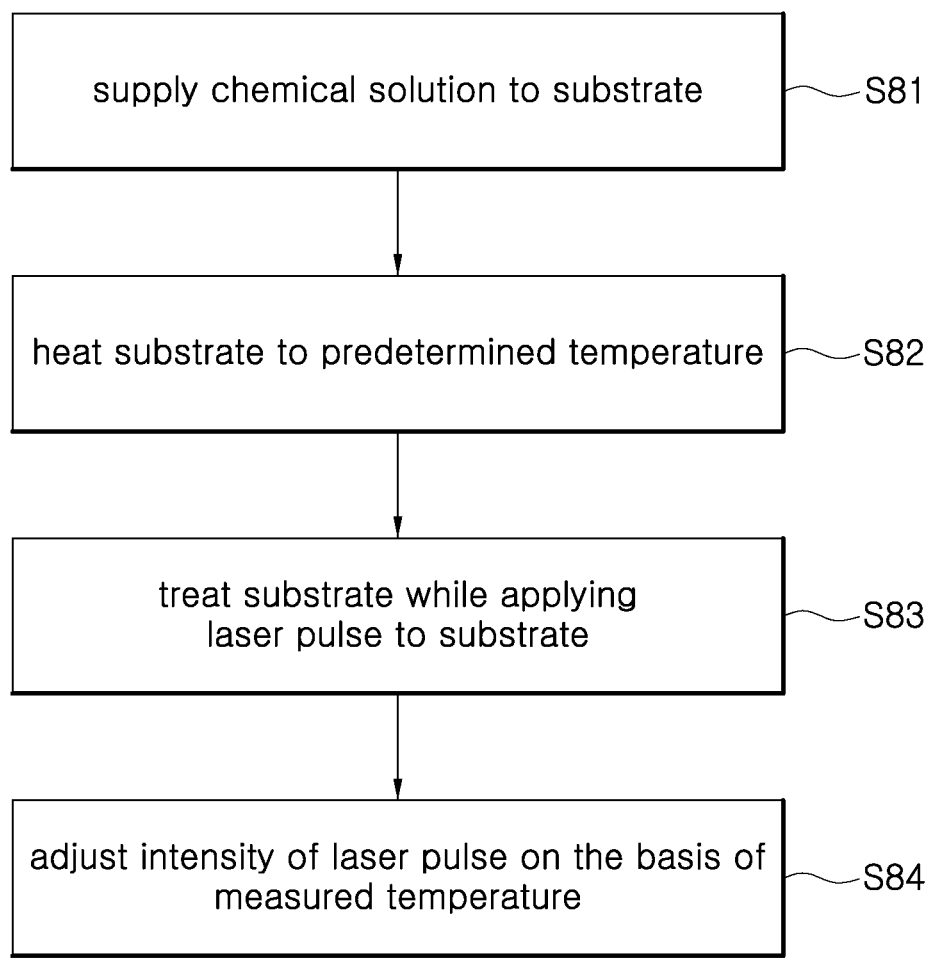
FIG. 8 is a flowchart illustrating a substrate treatment method according to a further embodiment of the present invention.

FIG. 8 is a flowchart illustrating a substrate treatment method according to a further embodiment of the present invention. Referring to FIG. 8, the substrate treatment method includes: supplying a chemical solution to a substrate (S81), heating the substrate to a predetermined temperature (S82), performing a surface treatment while applying a laser pulse to the substrate (S83), and adjusting the intensity of the laser pulse on the basis of a temperature measured. Since steps S81 through S83 are the same as steps S31 through S33 of FIG. 3, a detailed description thereof will be omitted.

Figure 9:
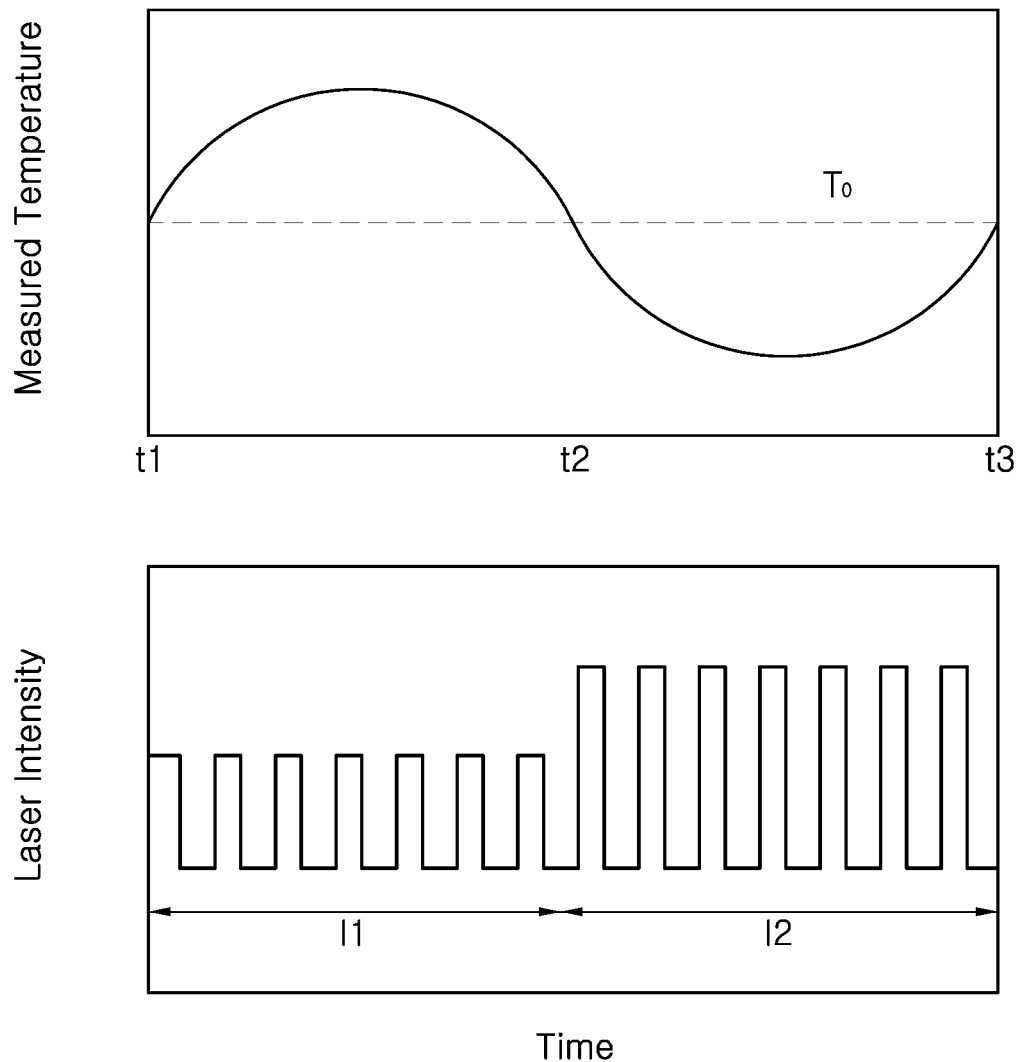
FIG. 9 is a view illustrating changes in laser pulse and substrate temperature in the embodiment shown in FIG. 8.

In the embodiment illustrated in FIG. 6, the duty ratio of the laser pulse is adjusted to compensate for temperature changes which occur during the application of the laser pulses. However, in the embodiment illustrated in FIG. 8, the intensity of the laser pulse is adjusted. In step S84, the intensity of the laser pulse is adjusted on the basis of the temperature measured by the temperature measurement member 170. As illustrated in FIG. 9, when the temperature exceeds a reference temperature To a laser pulse with a relatively low intensity I1 is applied to the substrate. On the other hand, when the temperature falls below the reference temperature To, a laser pulse with a relatively high intensity I2 is applied to the substrate. FIG. 9 illustrates a method of switching the laser intensity between the intensity I1 and the intensity I2 according to the measured temperature. However, the laser intensity may be controlled such that the intensity of the laser pulse continuously changes according to the difference between the measured temperature and the reference temperature To.

On the other hand, the embodiment of FIG. 6 and the embodiment of FIG. 8 may be performed together. That is, the duty ratio and the intensity of the laser pulse may be adjusted simultaneously on the basis of the measured temperature.

It will be apparent to those skilled in the art that various modifications are possible within the scope of the present invention. All or some of the embodiments may optionally be implemented in combination. Accordingly, the scope of protection should be determined by the description of the claims and their equivalents.

What is claimed is:

1. A substrate treatment apparatus comprising:
   a substrate support unit made of a transparent material with respect to a pulsed laser beam and configured to rotatably support a substrate;
   a chemical supply unit configured to eject a chemical solution onto an upper surface of a substrate supported on the substrate support unit, wherein a first portion of the chemical solution ejected forms a chemical film on the upper surface of the substrate and a second portion of the chemical solution ejected is scattered from the substrate;
   a chemical recovery unit configured to surround the substrate support unit to collect the second portion of the chemical solution scattered from the substrate to recycle the chemical solution scattered from the substrate;
   a laser irradiation unit positioned below the substrate support unit and configured to heat the substrate by applying the pulsed laser beam to the substrate through the substrate support unit;
   a temperature measurement member configured to measure a temperature of the chemical film formed on the upper surface of the substrate; and
   a controller configured to control the laser irradiation unit to emit the pulsed laser beam on the basis of the measured temperature of the chemical film such that the substrate is repeatedly heated and cooled to maintain a preset temperature,
   wherein the substrate has a stacked structure in which a silicon oxide film and a silicon nitride film are alternately and repeatedly stacked on each other and a slit extending through the silicon oxide film and the silicon nitride film serves as a passage through which the chemical solution is supplied, and
   the chemical solution is an etching solution for selectively etching the silicon nitride film from the stacked structure while etching of the silicon oxide film is suppressed.

2. The apparatus according to claim 1,
   wherein the controller is further configured to control the laser irradiation unit such that an intensity of the pulsed laser beam is adjusted according to the temperature measured by the temperature measurement member.

3. The apparatus according to claim 1,
wherein the controller is further configured to control the laser irradiation unit such that the intensity of the pulsed laser beam changes according to a difference between a reference temperature and the temperature measured by the temperature measurement member.

4. The apparatus according to claim 1,
wherein the laser irradiation unit is disposed below the substrate and configured to emit the pulsed laser beam toward a rear surface of the substrate.

5. The apparatus according to claim 1,
wherein the pulsed laser beam is a pulse in which a first time duration for which the pulse has a first laser intensity and a second time duration for which the pulse has a second laser intensity are alternately repeated, and
wherein the second laser intensity is smaller than the first laser intensity, and equal to or greater than zero intensity.

6. The apparatus according to claim 1,
wherein the controller is further configured to control the laser irradiation unit such that a duty ratio of the pulsed laser beam changes according to a difference between a reference temperature and the temperature measured by the temperature measurement member.

7. The apparatus according to claim 1,
wherein the laser irradiation unit comprises:
a laser generation member configured to receive a signal from a pulse generator and to generate the pulsed laser beam;
a lens member including a plurality of lenses and configured to refract the pulsed laser beam generated by the laser generation member so that the pulsed laser beam is applied to the substrate;
a reflection unit configured to reflect a first portion of the pulsed laser beam generated by the laser generation member toward the lens member and to pass a second portion of the pulsed laser beam;
an image pickup unit connected to the reflection unit and configured to form an image from the second portion of the pulsed laser beam passing through the reflection unit and to convert the image into image data; and
a sensing unit engaged with the reflection unit and configured to sense an intensity of the pulsed laser beam incident on the reflection unit.

* * * * *